United States Patent
Chen et al.

(10) Patent No.: US 12,209,326 B2
(45) Date of Patent: Jan. 28, 2025

(54) SILICON MATERIAL PROCESSING APPARATUS, SILICON INGOT PRODUCTION EQUIPMENT, AND SILICON MATERIAL PROCESSING METHOD

(71) Applicants: XI'AN ESWIN MATERIAL TECHNOLOGY CO., LTD., Xi'an (CN); XI'AN ESWIN SILICON WAFER TECHNOLOGY CO., LTD., Xi'an (CN)

(72) Inventors: Fan Chen, Xi'an (CN); Pengju Zhang, Xi'an (CN); Chaochao Guo, Xi'an (CN)

(73) Assignees: XI'AN ESWIN MATERIAL TECHNOLOGY CO., LTD., Xi'an (CN); XI'AN ESWIN SILICON WAFER TECHNOLOGY CO., LTD., Xi'an (CN)

( * ) Notice: Subject to any disclaimer, the term of this patent is extended or adjusted under 35 U.S.C. 154(b) by 0 days.

(21) Appl. No.: 18/571,398

(22) PCT Filed: Sep. 30, 2022

(86) PCT No.: PCT/CN2022/122975
§ 371 (c)(1),
(2) Date: Dec. 18, 2023

(87) PCT Pub. No.: WO2023/124337
PCT Pub. Date: Jul. 6, 2023

(65) Prior Publication Data
US 2024/0271318 A1    Aug. 15, 2024

(30) Foreign Application Priority Data
Dec. 28, 2021    (CN) .......................... 202111622589.5

(51) Int. Cl.
*C30B 15/02*     (2006.01)
*C30B 15/00*     (2006.01)
(Continued)

(52) U.S. Cl.
CPC ............ *C30B 15/26* (2013.01); *C30B 15/002* (2013.01); *C30B 15/02* (2013.01); *C30B 29/06* (2013.01); *C30B 35/005* (2013.01); *C30B 35/007* (2013.01)

(58) Field of Classification Search
CPC ... C30B 15/002; C30B 35/007; C30B 35/005; C30B 15/02; C30B 29/06
See application file for complete search history.

(56) References Cited

U.S. PATENT DOCUMENTS 6,284,040 B1 * 9/2001 Holder ................... C30B 15/02
117/13
6,589,332 B1 * 7/2003 Holder ................... C30B 15/02
382/206

(Continued)

FOREIGN PATENT DOCUMENTS

CN    1324414 A    11/2001
CN    205463232 U    8/2016
(Continued)

OTHER PUBLICATIONS

Written Opinion and International Search Report of the International Search Authority corresponding to International Application No. PCT/CN2022/122975, dated Dec. 15, 2023. (10 pages).

(Continued)

*Primary Examiner* — Matthew J Song
(74) *Attorney, Agent, or Firm* — Maginot, Moore & Beck LLP

(57) ABSTRACT

A silicon material processing apparatus includes a feed assembly, a scanning assembly, a controller, and a loading
(Continued)

assembly. The feed assembly is used for conveying a silicon material and includes a feeding area, a scanning area, and a loading area sequentially arranged along the conveying direction. The silicon material to be conveyed is added to the feeding assembly in the feeding area. The scanning assembly is arranged correspondingly to the scanning area and is used for collecting silicon material information of a silicon material that is located in the scanning area. The silicon material information includes one or more of a shape characteristics and a size characteristics of the silicon material. The controller is connected with the scanning assembly and is used for generating a loading strategy according to the silicon material information.

7 Claims, 1 Drawing Sheet

(51) Int. Cl.
    *C30B 15/26*     (2006.01)
    *C30B 29/06*     (2006.01)
    *C30B 35/00*     (2006.01)

(56) References Cited

U.S. PATENT DOCUMENTS

| | | | |
|---|---|---|---|
| 2003/0159647 A1* | 8/2003 | Arvidson | C30B 15/002 117/30 |
| 2014/0060422 A1* | 3/2014 | Martini | C30B 15/10 141/1 |
| 2017/0239666 A1* | 8/2017 | Kawaguchi | C30B 15/02 |

FOREIGN PATENT DOCUMENTS

| | | |
|---|---|---|
| CN | 109909184 A | 6/2019 |
| CN | 111020700 A | 4/2020 |
| CN | 111438053 A | 7/2020 |
| CN | 112442736 A | 3/2021 |
| CN | 114318509 A | 4/2022 |
| DE | 69905605 T2 | 11/2003 |

OTHER PUBLICATIONS

English Translation of Written Opinion and International Search Report of the International Search Authority corresponding to International Application No. PCT/CN2022/122975, dated Dec. 15, 2023. (5 pages).
Chinese Office Action corresponding to Chinese Patent Application No. 202111622589.5, dated Sep. 30, 2022. (6 Pages).
English Translation of Chinese Office Action corresponding to Chinese Patent Application No. 202111622589.5, dated Sep. 30, 2022. (3 Pages).
Taiwanese Office Action corresponding to Taiwanese Patent Application No. 111129280, dated Apr. 14, 2023. (12 Pages).
English Translation of Taiwanese Office Action corresponding to Taiwanese Patent Application No. 111129280, dated Apr. 14, 2023. (5 Pages).
English Translation of CN109909184A. (24 Pages).
English Translation of CN112442736A. (21 Pages).
English Translation of CN205463232U. (6 Pages).
English Translation of CN1324414A. (14 Pages).
English Translation of CN111020700A. (45 Pages).
English Translation of CN114318509A. (17 Pages).
2nd Chinese Office Action corresponding to Chinese Patent Application No. 202111622589.5 dated Mar. 25, 2023 (5 Pages).
English Translation of 2nd Chinese Office Action corresponding to Chinese Patent Application No. 202111622589.5 dated Mar. 25, 2023 (7 Pages).
German Office Action corresponding to German Patent Application No. 11 2022 002 571.9, dated Sep. 5, 2024. (3 Pages).
English Translation of German Office Action corresponding to German Patent Application No. 11 2022 002 571.9, dated Sep. 5, 2024. (3 Pages).
English Translation of DE69905605T2. (14 Pages).
English Translation of CN111438053A. (16 Pages).

* cited by examiner

SILICON MATERIAL PROCESSING APPARATUS, SILICON INGOT PRODUCTION EQUIPMENT, AND SILICON MATERIAL PROCESSING METHOD

This application is the U.S. national phase of PCT Application No. PCT/CN2022/122975 filed on Sep. 30, 2022, which claims a priority of the Chinese patent application No. 202111622589.5 filed on Dec. 28, 2021, which are incorporated herein by reference in their entireties.

TECHNICAL FIELD

The present disclosure relates to the field of semiconductor materials processing technology, in particular to a silicon material processing apparatus, a silicon ingot production equipment, and a silicon material processing method.

BACKGROUND

In the production of monocrystalline silicon ingots in related technologies, polycrystalline silicon materials are mainly used as feedstocks, and after the silicon materials being heated and melted, the monocrystalline silicon ingots are obtained through the crystal growing process. The dumping method in related technologies is usually to periodically add the certain weight of silicon materials to the crucible containing molten silicon materials and the silicon materials are heated and melted to form silicon melt. However, the melting speed and efficiency of silicon materials with different shapes and sizes are different, which results in the fact that although the supplement speed of silicon materials is uniform in weight, the supplement speed of silicon melt is fluctuated, which may cause structural loss during the crystal growing process.

SUMMARY

In a first aspect, an embodiment of the present disclosure provides a silicon material processing apparatus, comprising:
  a feeding assembly, being used for conveying a silicon material, the feeding assembly comprising a feeding area, a scanning area, and a loading area sequentially arranged along the conveying direction, wherein the silicon material to be conveyed is added to the feeding assembly in the feeding area;
  a scanning assembly, being arranged correspondingly to the scanning area, the scanning assembly being used for collecting silicon material information of a silicon material that is located in the scanning area, and the silicon material information including one or more of a shape characteristics and a size characteristics of the silicon material;
  a controller, being connected with the scanning assembly, the controller being used for generating a loading strategy according to the silicon material information; and
  a loading assembly, being arranged correspondingly to the loading area, the loading assembly being used for moving, according to the loading strategy, the silicon material that is located in the loading area to a target position.
In some embodiments, the feeding assembly comprises a conveyor belt arranged in a loop, during a process of conveying silicon material, the conveyor belt turning circularly in a direction from the feeding area to the scanning area and the loading area.

In some embodiments, the feeding assembly further comprises a cleaning area, the cleaning area being located between the loading area and the feeding area. The silicon material processing apparatus further comprises a cleaning assembly, the cleaning assembly being arranged the cleaning area, the cleaning assembly being used for cleaning the portion of the conveyor belt located in the cleaning area.

In some embodiments, the feeding assembly further comprises a dust removal area, the dust removal area being located between the feeding area and the scanning area, and wherein the silicon material processing apparatus further comprises a dust removal assembly, the dust removal assembly being arranged correspondingly to the dust removal area, and being used for performing dust removal treatment on the silicon material located in the dust removal area.

In some embodiments, the dust removal assembly comprises a plurality of air nozzles, an arc-shaped track and a driving portion, the arc-shaped track being located above the conveyor belt, the plurality of air nozzles being arranged on the arc-shaped track, and the plurality of air nozzles being arranged toward the conveyor belt, the driving portion being used for driving the air nozzles to move back and forth on the arc-shaped track.

In a second aspect, an embodiment of the present disclosure provides a silicon ingot production equipment, comprising a crystal pulling apparatus and a supply apparatus, the silicon material processing apparatus being used for providing silicon material to the crystal pulling apparatus, the supply apparatus being the silicon material processing apparatus described by any of the above.

In a third aspect, an embodiment of the present disclosure provides a silicon material processing method, comprising:
  obtaining a silicon material information of a silicon material, the silicon material information including one or more of a shape characteristics and a size characteristics of the silicon material;
  generating a loading strategy according to the silicon material information; and
  controlling a loading assembly according to the loading strategy to provide the silicon material to a target position.

In some embodiments, the silicon material information including a shape characteristics of the silicon material, and obtaining a silicon material information of a silicon material, comprises:
  obtaining an overall shape of the silicon material by scanning, and determining an angular coefficient of the silicon material according to the overall shape, the angular coefficient including one or more of the number of angularities and the sharpness of the angularities;
  scanning a surface structure of the silicon material, and determining a smoothness coefficient of the silicon material according to the surface structure; and
  generating the silicon material information including the shape characteristics of the silicon material, wherein the shape characteristics includes the angular coefficient and the smoothness coefficient.

In some embodiments, the silicon material information including a size characteristics of the silicon material, and obtaining the silicon material information of the silicon material, comprises:
  scanning a maximum size of the silicon material in different dimensions;

determining the size characteristics of the silicon material according to a difference in the maximum size of the silicon material in different dimensions; and generating the silicon material information including the size characteristics.

In some embodiments, generating a loading strategy according to the silicon material information, comprises:

determining a feeding interval according to a production status of a silicon ingot, wherein the feeding interval includes at least one of a shape interval corresponding to the shape characteristics of the silicon material and a size interval corresponding to the size characteristics of the silicon material;

marking the silicon material whose silicon material information satisfies the feeding interval as a silicon material to be added; and marking the silicon material whose silicon material information does not satisfy the feeding interval as a recycled silicon material.

DETAILED DESCRIPTION

The present disclosure will be described hereinafter in a clear and complete manner in conjunction with the drawings and embodiments. Obviously, the following embodiments are merely a part of, rather than all of, the embodiments of the present disclosure. Where not conflicting, the embodiments of the present disclosure and features within the embodiments may be combined with each other to obtain new embodiments. Based on the embodiments of the present disclosure, a person skilled in the art may obtain the other embodiments, which also fall within the scope of the present disclosure.

The embodiment of the disclosure provides a silicon material processing apparatus.

In one embodiment, the silicon material processing apparatus comprises a feeding assembly 200, a scanning assembly, a controller and a loading assembly.

The embodiment of the disclosure further provides a silicon material processing method.

Figure 1:
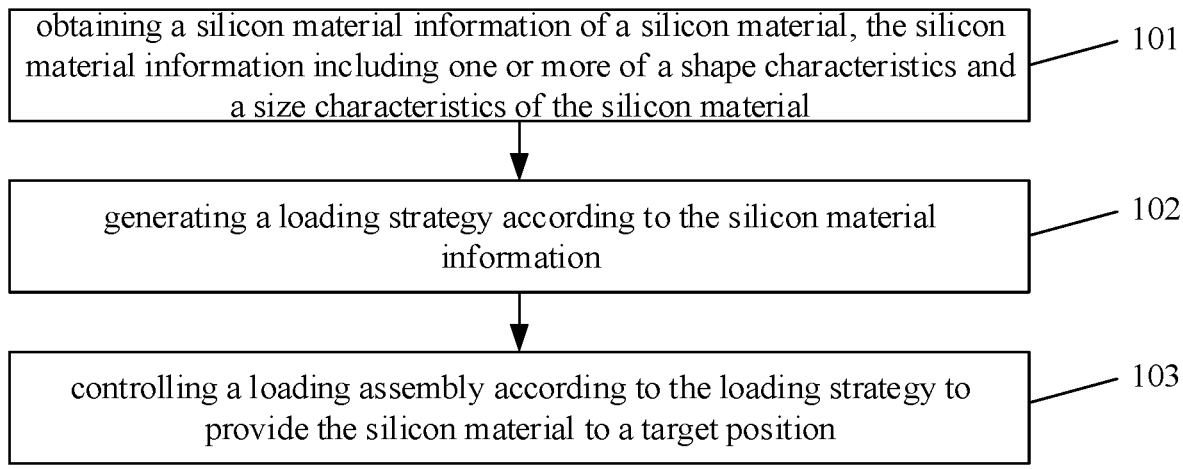
FIG. 1 is a flow chart of a silicon material processing method according to one embodiment of the present disclosure.

As shown in FIG. 1, in one embodiment, the silicon material processing method comprises:

Step 101: obtaining a silicon material information of a silicon material, the silicon material information including one or more of a shape characteristics and a size characteristics of the silicon material;

Step 102: generating a loading strategy according to the silicon material information; and Step 103: controlling a loading assembly according to the loading strategy to provide the silicon material to a target position.

The silicon material processing method is applied to the silicon material processing apparatus in the present embodiment for illustrative illustration.

Figure 2:
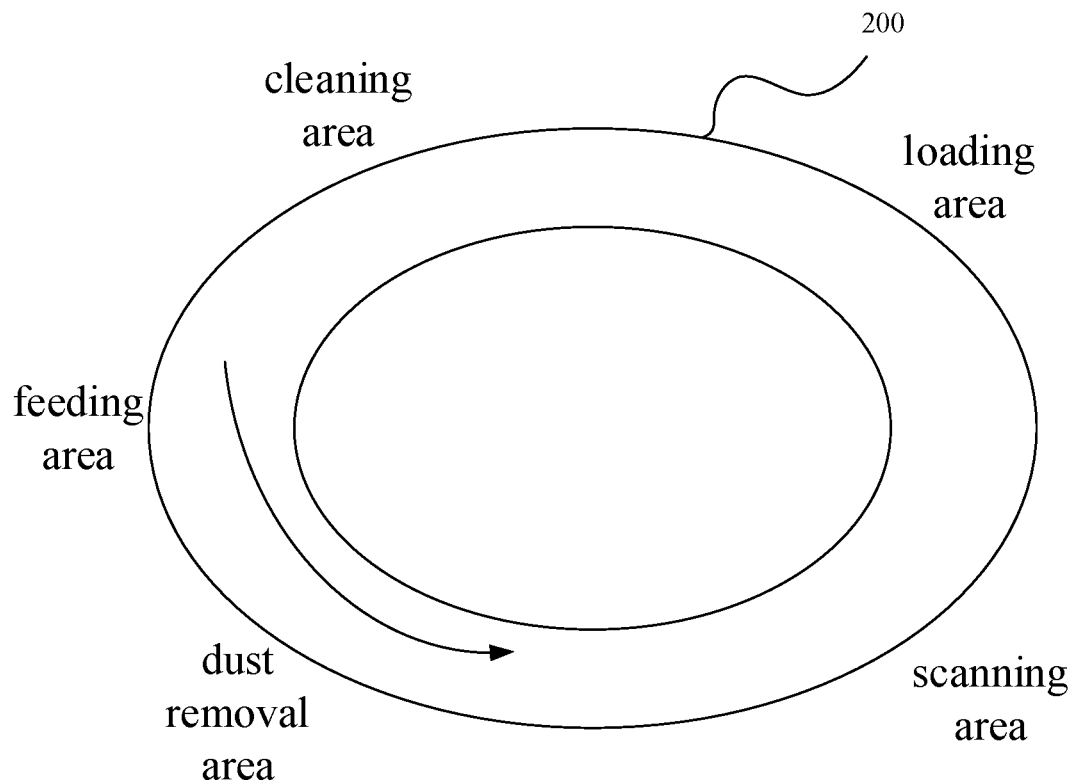
FIG. 2 is a schematic view of different zoning of feeding assembly according to one embodiment.

In some embodiments, the feeding assembly 200 is used for conveying, as shown FIG. 2, the feeding assembly 200 includes a feeding area, a scanning area, and a loading area sequentially arranged along the conveying direction.

In this embodiment, a silicon material to be conveyed is added to the feeding assembly 200 in the feeding area and is moved to a target position in the loading area. The loading assembly is arranged correspondingly to the loading area, and the loading assembly can choose equipment such as a manipulator to grab and move the silicon material in the loading area to the target position. Generally speaking, the silicon material is moved to the crystal pulling apparatus in the loading area as the feedstock for the crystal growing process, which means that the target position is the feeding area of the crystal pulling apparatus.

The scanning assembly is arranged correspondingly to the scanning area, the scanning assembly in this embodiment can be a scanning assembly such as a video camera or a laser scanner, etc., and the scanning assembly is used to scan the silicon material, so as to collect the silicon material information of the silicon material located in the scanning area. Specifically, the silicon material information includes one or more of the shape characteristics and the size characteristics of the silicon material.

The controller is connected with the scanning assembly, and the controller is used for generating a loading strategy according to the silicon material information.

As well appreciated, the melting speed of silicon material with different shapes and sizes are different. For example, for two pieces of silicon material of the same weight, the melting speed of a small-size silicon material is faster under the same conditions. For another example, for two pieces of silicon material of the same size, the melting speed of a smooth-surface silicon material is lower than that of a silicon material with a rough-surface.

In the embodiments, after obtaining the silicon material information by scanning, the corresponding loading strategy is further generated, and the loading assembly moves the silicon material located in loading area to the target position according to the loading strategy generated. In this way, by controlling the loading process, the supplement speed of the silicon melt is more stable, so that the crystal growing process is more stable, and the possibility of silicon ingot structural loss is somehow reduced.

The feeding assembly 200 in the embodiments of the disclosure comprises a scanning area, and by arranging a scanning assembly towards scanning area, the silicon material information of the silicon material located in the scanning area can be collected. Furthermore, a corresponding loading strategy can be generated according to the silicon material information. In the technical scheme of the present embodiment, the influence of characteristics such as the shape and size of the silicon material on the melting speed of the silicon material is considered during the loading process, so that the supplement of silicon melt is more stably realized, and the possibility of silicon ingot structural loss in the crystal growing process is somehow reduced.

In some embodiments, as shown in FIG. 2, the feeding assembly 200 comprises a conveyor belt arranged in a loop. As illustrated, in the process of transporting silicon material, the conveyor belt turning circularly in a direction from the feeding area to the scanning area and the loading area, and an arrow in FIG. 2 represents the turning direction of the conveyor belt.

It is important to understand that a loop conveyor belt can be round or not. As an example, it can refer to the airport baggage claim system, the conveyor belt can move cycled, so that if a piece of silicon material fails to be moved to the target position by the loading assembly, such piece of silicon material will be driven by the conveyor belt to move in a circular way.

If the silicon material in the current loading area does not meet the loading requirements, the loading of the silicon material can be temporarily skipped, and the silicon material can be cycled through the feeding area and the scanning area again until the silicon material meets the loading requirements, and then the silicon material is moved to the target location.

The conveyor belt arranged in a loop can prevent the accumulation of silicon material that does not meet the loading requirements in the loading area, which helps to improve the loading effect.

In some embodiments, the feeding assembly 200 further comprises a cleaning area, the cleaning area being located between the loading area and the feeding area. Moreover, the silicon material processing apparatus further comprises a cleaning assembly, the cleaning assembly being arranged correspondingly to the cleaning area, and the cleaning assembly being used for cleaning the portion of the conveyor belt located in the cleaning area, so as to ensure the cleanliness of the conveyor belt and help reduce contamination imposed upon the silicon material.

In some embodiments, the feeding assembly 200 further comprises a dust removal area, which is located between the feeding area and the scanning area. Moreover, the silicon material processing apparatus further comprises a dust removal assembly, the dust removal assembly being arranged correspondingly to the dust removal area, the dust removal assembly being used for cleaning the portion of the conveyor belt located in the dust removal area.

In some embodiments, the dust removal assembly comprises a plurality of air nozzles, an arc-shaped track and a driving portion, the arc-shaped track being located above the conveyor belt, the plurality of air nozzles being arranged on the arc-shaped track, and the plurality of air nozzles being arranged toward the conveyor belt, the driving portion being used for driving the air nozzle to move back and forth on the arc-shaped track.

In this embodiment, a plurality of air nozzles is arranged, each of which is connected with a high-pressure air pump. And the plurality of air nozzles move back and forth on the arc-shaped track, so that the dust removal operation can be performed at multiple angles. As a result, various impurities, dust and silicon material powder are prevented from entering the scanning area and the loading area downstream, which helps to avoid interference against the scanning process of the silicon material, and also avoid impurities from adhering to the silicon material and affecting the subsequent crystal growing process.

In some embodiments, the silicon material information includes shape characteristics of the silicon material. And the obtaining a silicon material information of a silicon material comprises:
  obtaining an overall shape of the silicon material by scanning, and determining an angular coefficient of the silicon material according to the overall shape, the angular coefficient including one or more of the number of angularities and the sharpness of the angularities;
  scanning a surface structure of the silicon material, and determining a smoothness coefficient of the silicon material according to the surface structure; and
  generating the silicon material information including the shape characteristics of the silicon material, wherein the shape characteristics includes the angular coefficient and the smoothness coefficient.

In this embodiment, for the shape of the silicon material, the main statistical information is about the angularity of the silicon material, the angular coefficient is used to indicate the information related to the angularity. Specifically, the angular coefficient includes one or more of the number of angularities and the sharpness of the angularities. Here, the more the number of angularities, the faster the melting speed of the silicon material. And the greater the sharpness of the angularities, the faster the melting speed of the polysilicon material. Therefore, in the present embodiment, the angular coefficient can be set as a quantity positively correlated with the number of angularities and the sharpness of the angularities.

For example, if the number of angularities of a silicon material is 10, and the sharpness of 8 angularities is greater than 90 degrees, the sharpness coefficient of these 8 angularities is 0.8. And if the sharpness of 2 angularities is less than 90 degrees, the sharpness coefficient of these 2 angularities is 1. In this way, by weighting the sharpness coefficients, the angular coefficient of the silicon material can be obtained as 0.8*8+1*2=8.4. Under the same other conditions, the higher the angular coefficient, the faster the melting speed of silicon material.

For another example, the higher the smoothness of the surface of silicon material, the slower the melting speed. Therefore, the smoothness coefficient is defined as a value between 0 and 1. And the higher the smoothness, the smaller the smoothness coefficient.

In some embodiments, the silicon material information includes size characteristics of the silicon material. And the obtaining the silicon material information of the silicon material comprises:
  scanning a maximum size of the silicon material in different dimensions;
  determining the size characteristics of the silicon material according to a difference in the maximum size of the silicon material in different dimensions; and
  generating the silicon material information including the size characteristics.

In this embodiment, different dimensions can refer to the length, width, and height of the silicon material. Generally speaking, the shape of the silicon material is not of a regular one. Therefore, in this embodiment, the maximum sizes on each dimension are obtained.

For example, there are two silicon materials with the same volume and weight, one of which is relatively slender, while the other is close to spherical. Therefore, the melting speed of a spherical silicon material is lower than that of a slender silicon material. It can be understood that if the three-dimensional sizes of the silicon material are relatively similar, the melting speed of the silicon material is slow. And if the three-dimensional dimensions are significantly different, the melting speed is fast.

In this embodiment, after obtaining the maximum size in different dimensions, a size coefficient is determined based on the size relationship of the maximum size in different dimensions as the size characteristic of the silicon material.

It can be understood that if the three-dimensional sizes of the silicon material are more similar, the size coefficient is smaller, and the melting speed of the silicon material is slower. If the difference in three-dimensional dimensions of the silicon material is larger, the size coefficient is larger, and the melting speed of the silicon material is faster.

In this way, based on the size characteristics of the silicon material in various dimensions, the silicon material information related to the size characteristics can be determined.

In some embodiments, generating a loading strategy according to the silicon material information comprises:
  determining a feeding interval according to a production status of a silicon ingot. Specifically, the feeding interval includes at least one of a shape interval corresponding to the shape characteristics of the silicon material and a size interval corresponding to the size characteristics of the silicon material;

marking the silicon material whose silicon material information satisfies the feeding interval as a silicon material to be added; and marking the silicon material whose silicon material information does not satisfy the feeding interval as a recycled silicon material.

After determining the size and shape characteristics of the silicon material, a melting coefficient related to the melting speed of the silicon material can be determined by combining the size and shape characteristics of the silicon material. For example, the melting coefficient can be calculated by the following formula:

$$S0 = A*S1 + B*S2.$$

Among them, S0 is the melting coefficient, and A and B are two coefficients that can be set according to needs or experience. S1 is the coefficient determined based on size characteristics, S2 is the coefficient determined based on shape characteristics, which can be obtained by weighting the sharpness coefficient and smoothness coefficient mentioned above.

During implementation, the melting coefficient range of the silicon material that needs to be added is determined in conjunction with the current production process. If a piece of silicon material meets the requirements, it is marked as the silicon material to be added. When the silicon material is moved to the loading area, it is moved to the feeding area of the crystal pulling apparatus through the loading assembly.

If a piece of silicon material does not meet the requirements, it will be marked as recycled silicon material, and the silicon material will be circulated again through the conveying assembly to avoid interference against the feeding process.

For example, based on the current production process, silicon materials with a melting coefficient between 5 and 10 can be added. If a piece of silicon material has a melting coefficient of 8, the silicon material will be marked as the silicon material to be added. If a piece of silicon material has a melting coefficient of 12, the silicon material will be marked as the recycled silicon material.

Furthermore, in some embodiments, in order to improve the loading effect of the silicon material, the comprehensive melting coefficient of multiple pieces of silicon material can also be counted, so that the melting speed of can be balanced by adding the silicon material with faster melting speed and the silicon material with slower melting speed, which is conducive to improving the loading effect.

The embodiments of the disclosure provide a silicon ingot production equipment comprising a crystal pulling apparatus and a supply apparatus, the silicon material processing apparatus is used for providing silicon material to the crystal pulling apparatus, and the supply apparatus is any one of the above silicon material processing apparatuses. The technical scheme of the present embodiment includes all the technical schemes of the embodiment of the silicon material processing apparatus, so that at least all the technical effects of the above can be realized, and will not be repeated herein.

The above are only specific embodiments of this present disclosure, but the protection scope of the present disclosure is not limited thereto. Within the scope of the art disclosed in this disclosure, a change or replacement can be easily thought by any person skilled in the art should be covered by the scope of protection of this disclosure. Therefore, the protection scope of the present disclosure should be subject to the protection scope of the claims.

What is claimed is:

1. A silicon material processing apparatus, comprising:
a feeding assembly, being used for conveying a silicon material, the feeding assembly comprising a feeding area, a scanning area, and a loading area sequentially arranged along a conveying direction, wherein the feeding assembly further comprises a conveyor belt arranged in a loop, during a process of conveying the silicon material, the conveyor belt turning circularly in a direction from the feeding area to the scanning area and the loading area, and wherein the silicon material to be conveyed is added to the feeding assembly in the feeding area;
a scanning assembly, being arranged towards the scanning area, the scanning assembly configured to collect silicon material information of the silicon material that is located in the scanning area, and the silicon material information comprising one or more of shape characteristics and size characteristics of the silicon material;
a controller, being connected with the scanning assembly, the controller configured to generate a loading strategy according to the silicon material information; and
a loading assembly, being arranged towards the loading area, the loading assembly being used for moving, according to the loading strategy, the silicon material that is located in the loading area to a target position, wherein the target position is a feeding area of a crystal pulling apparatus, and a piece of silicon material that fails to be moved to the target position by the loading assembly is driven by the conveyor belt to move in a circular way.

2. The apparatus according to claim 1, wherein the feeding assembly further comprises a cleaning area, the cleaning area being located between the loading area and the feeding area, and
wherein the silicon material processing apparatus further comprises a cleaning assembly, the cleaning assembly being arranged towards the cleaning area, the cleaning assembly configured to clean the portion of the conveyor belt located in the cleaning area.

3. The apparatus according to claim 1, wherein the feeding assembly further comprises a dust removal area, the dust removal area being located between the feeding area and the scanning area, and
wherein the silicon material processing apparatus further comprises a dust removal assembly, the dust removal assembly being arranged correspondingly to the dust removal area, and configured to perform dust removal treatment on the silicon material located in the dust removal area.

4. The apparatus according to claim 3, wherein the dust removal assembly comprises a plurality of air nozzles, an arc-shaped track and a driving portion, the arc-shaped track being located above the conveyor belt, the plurality of air nozzles being arranged on the arc-shaped track, and the plurality of air nozzles being arranged toward the conveyor belt, the driving portion being used for driving the air nozzles to move back and forth on the arc-shaped track.

5. A silicon ingot production equipment, comprising a crystal pulling apparatus and a supply apparatus, the silicon material processing apparatus configured to provide silicon material to the crystal pulling apparatus, the supply apparatus being the silicon material processing apparatus according to claim 1.

6. A silicon material processing method, comprising:

obtaining a silicon material information of a silicon material, the silicon material information comprising one or more of shape characteristics and size characteristics of the silicon material;

generating a loading strategy according to the silicon material information; and controlling a loading assembly according to the loading strategy to provide the silicon material to a target position;

wherein the generating the loading strategy according to the silicon material information, comprises:

determining a feeding interval according to a production status of a silicon ingot, wherein the feeding interval comprises at least one of a shape interval corresponding to the shape characteristics of the silicon material and a size interval corresponding to the size characteristics of the silicon material;

marking the silicon material whose silicon material information satisfies the feeding interval as a silicon material to be added; and marking the silicon material whose silicon material information does not satisfy the feeding interval as a recycled silicon material, wherein the silicon material information comprising the shape characteristics of the silicon material, and the obtaining the silicon material information of the silicon material, comprises:

obtaining an overall shape of the silicon material by scanning, and determining an angular coefficient of the silicon material according to the overall shape, the angular coefficient comprising one or more of a number of angularities and a sharpness of the angularities;

scanning a surface structure of the silicon material, and determining a smoothness coefficient of the silicon material according to the surface structure; and generating the silicon material information comprising the shape characteristics of the silicon material, wherein the shape characteristics comprise the angular coefficient and the smoothness coefficient.

7. The silicon material processing method according to claim 6, wherein the silicon material information comprising size characteristics of the silicon material, and the obtaining the silicon material information of the silicon material, comprises:

scanning a maximum size of the silicon material in different dimensions;

determining the size characteristics of the silicon material according to a difference in the maximum size of the silicon material in different dimensions; and generating the silicon material information comprising the size characteristics.

* * * * *